United States Patent [19]

Kaviani et al.

[11] Patent Number: 6,140,839

[45] Date of Patent: Oct. 31, 2000

[54] COMPUTATIONAL FIELD PROGRAMMABLE ARCHITECTURE

[76] Inventors: Alireza S. Kaviani, 485 Huron Street, Toronto, Ontario, Canada, M5R 2R5; Steven D. Brown, 92 Rosewell Avenue, Toronto, Ontario, Canada, M4R 2A3

[21] Appl. No.: 09/076,822

[22] Filed: May 13, 1998

[51] Int. Cl.[7] ........................ H03K 19/177; H03K 19/173
[52] U.S. Cl. ................................ 326/39; 326/41; 326/47
[58] Field of Search .................................. 326/39, 38, 40, 326/41, 47, 37

[56] References Cited

U.S. PATENT DOCUMENTS

| | | | |
|---|---|---|---|
| 5,338,983 | 8/1994 | Agarwala | 326/41 |
| 5,570,039 | 10/1996 | Oswald et al. | 326/39 |
| 5,818,254 | 10/1998 | Agrawal et al. | 326/39 |
| 5,926,036 | 7/1999 | Cliff et al. | 326/40 |
| 5,966,027 | 10/1999 | Kapusta et al. | 326/39 |

OTHER PUBLICATIONS

Carl Ebeling, Darren C. Cronquist and Paul Franklin, "RaPiD—Reconfigurable Pipelined Datapath", FPL '96: The 6th International Workshop on Field Programmable Logic and Applications, pp. 126–135.Springer—Verlag, 1996.

Don Cherepacha and David Lewis, "DP–FPGA: An FPGA Architecture Optimized for Datapaths", pp. 1 to 25, (Published in VLSI & Designs 1996 vol. 4, pp. 329–343).

*Primary Examiner*—Michael Tokar
*Assistant Examiner*—James P. Cho
*Attorney, Agent, or Firm*—Barrigar & Moss; David Greer

[57] ABSTRACT

A computational field programable architecture targeted for compute intensive applications. The architecture is hierarchical and includes, for implementation of data path circuits, clusters of programable logic blocks that are designed to provide area-efficient realization of common arithmetic structures such as adders, subtracters and multipliers. The architecture includes a LUTb cluster for implementing the control part of a circuit. The programable logic blocks each include a stack of programable bit-slice logic elements each having 2 data inputs and a single data output, and a 1-bit full adder circuit. The bit slice logic elements allow bit-wise logic operations to be carried out and the programable logic blocks also include comparator logic to enable comparison operations to be performed. The bit slice logic elements each include a DFF at their output, and the DFFs in a programable logic blocks can be combined to form a register. The inputs of each of the programable logic blocks are connected to cluster level tracks through a partially populated crossbar.

17 Claims, 9 Drawing Sheets

COMPUTATIONAL FIELD PROGRAMMABLE ARCHITECTURE

BACKGROUND OF THE ART

The present invention pertains to field programmable devices, and in particular to a computational field programmable architecture.

Since their introduction in the 1980's, Field Programmable Devices (FPDs) have become an integral tool for digital circuit implementation. FPDs offer many advantages over conventional VLSI designs in areas such as manufacturing cost, time--to--market and in-system modification. However, the benefits of using FPDs come at a price. Re-programmable hardware is inferior in both speed and area compared to full custom VLSI circuit implementations.

FPDs implement circuits by connecting a number of generic logic elements with a flexible interconnection network. The network consists of a series of wires joined through programmable switches, whose capacitance and resistance contribute to the relative slowness of FPD-implemented circuits. The interconnect of an FPD, which can account for close to 70 percent of its total area, is also largely responsible for the fact that FPDs are larger than custom VLSI circuits.

Traditional FPDs can be divided into two classes: Field Programmable Gate Arrays (FPGAs) and Complex Programmable Logic Devices (CPLDs). Both types of devices contain logic blocks, connected by a programmable interconnect. FPGA logic blocks typically rely on Look-Up Tables (LUTs) or multiplexers to provide functionality, while CPLDs use AND-OR planes.

FPDs are used for many applications such as communications, data processing, industrial/instrumentation applications, etc. One application class of interest is compute-intensive applications such as signal and media processing. FPDs are becoming a popular means of implementing signal and media processing algorithms because they can effectively extract parallelism. Compute-intensive circuits can often be divided into two main parts; data path, and control circuitry. The latter can be implemented efficiently in traditional FPGAs that are LUT-based. However, the data path of computational applications, which is often significantly larger than the control part of the circuit, cannot be efficiently realized in a LUT-based structure as general purpose FPDs do not offer area-efficient realizations for compute-intensive applications.

It is therefore desirable to provide computational field programmable architecture ("CFPA") that is designed for compute-intensive applications, and a core logic circuit for use in such an architecture. It is also desirable to provide an architecture that is specifically intended to efficiently realize data path operations.

SUMMARY OF THE INVENTION

The present invention provides an architecture that is specifically intended to efficiently realize common arithmetic operations such as addition, subtraction, and multiplication which are commonly found in compute intensive operations.

According to one aspect of the invention, there is provided a field programmable architecture for compute-intensive applications, comprising a section level interconnect channel, a first logic cluster for implementing control logic, comprising a plurality logic blocks inter-connected by a local interconnect channel that is in communication with the section level interconnect channel, and a second logic cluster for implementing data path operations, comprising a plurality of programable logic blocks interconnected by a cluster level interconnect channel that is in communication with the section level interconnect channel. The programable logic blocks of the second logic cluster have a different configuration than the logic blocks of the first logic cluster such that they provide a more area-efficient realization of adders, subtracters and partial multipliers than the logic blocks of the first logic cluster.

Preferably, the programable logic blocks are each configured to perform operations on two N-bit operands and comprise a stack of N bit-slice logic elements each having two data bit inputs, a data bit output, a multiply bit input, a carry-in bit input, and a carry-out bit output. The bit-slice logic elements are programable such that the programable logic block can be selectively configured to implement one of a ripple carry adder, subtracter and partial multiplier. Preferably, the carry-in bit input of each successive bit slice logic element is connected to the carry-out bit output of the preceding bit-slice logic element and the bit-slice logic elements each include a programable operation select circuit for processing inputs received by the two data bit inputs and the multiply bit input, and a 1-bit full adder circuit for generating a sum-bit output and the carry-bit output in response to information received from the operation select circuit and the carry-in bit input. The programable logic block includes control means for programming the operation select circuits of each of the bit slice logic elements in order to configure said programable logic block to selectively implement an adder, subtracter and partial multiplier.

Preferably, the programable operation select circuit of each of the bit-slice logic elements includes a plurality of multiplexers, and the control means includes a plurality of programable SRAM cells operatively connected to the multiplexers.

The programable logic block can include comparator logic connected to the bit slice logic elements for generating logic outputs based on the relative values of the two N-bit operands.

According to another aspect of the invention, there is provided a programmable logic block that can be configured to perform addition, subtraction and partial multiplication on two N-bit operands. The programable logic block comprises a stack of N bit-slice logic elements, each having two data bit inputs, a data bit output, a multiplier bit input, a carry-in bit input, and a carry-out bit output, the carry-in bit input of each successive bit-slice logic element being connected to the carry-out bit output of the preceding bit-slice logic element. The bit-slice elements each include a 1-bit full adder circuit for generating a sum-bit output on the data bit output and having carry logic connected to receive the carry-in bit input and generate an output on the carry-out bit output, and a programable operation select circuit connected to the 1-bit full adder circuit for selectively processing data received on the two data bit inputs and the multiplier control bit input, and providing the selectively processed data to the adder circuit. The operation select circuit of each of the bit-slice logic elements is programable such that the stack of bit-slice logic elements can selectively implement adders, subtracters and partial multipliers. The programable logic block includes control means for programming the operation select circuit of each of the bit-slice logic elements.

According to still a further aspect of the invention, there is provided a programmable logic cluster for implementing data path operations comprising plurality of programable logic blocks for performing operations on 2 N-bit operands, the programable logic blocks each having 2 sets of N data bit inputs, a carry-in bit input, a multiply bit input, a carry-out bit output and a set of N data bit outputs, and including N bit-slice logic elements for performing bit-wise operations on the operands, the programable logic blocks being programmable to realize adders, subtracters, and partial multipliers. The cluster also comprises a cluster level interconnect channel interconnecting the plurality of programable logic blocks, the interconnect channel having a plurality of cluster level tracks connected to the inputs of each of the programable logic blocks through switches located on a partially populated crossbar.

BRIEF DESCRIPTION OF THE DRAWINGS

In the drawings:

FIG. 4b is a block diagram of a logic cell of the array of FIG. 4a;

DESCRIPTION OF THE PREFERRED EMBODIMENTS

Figure 6:
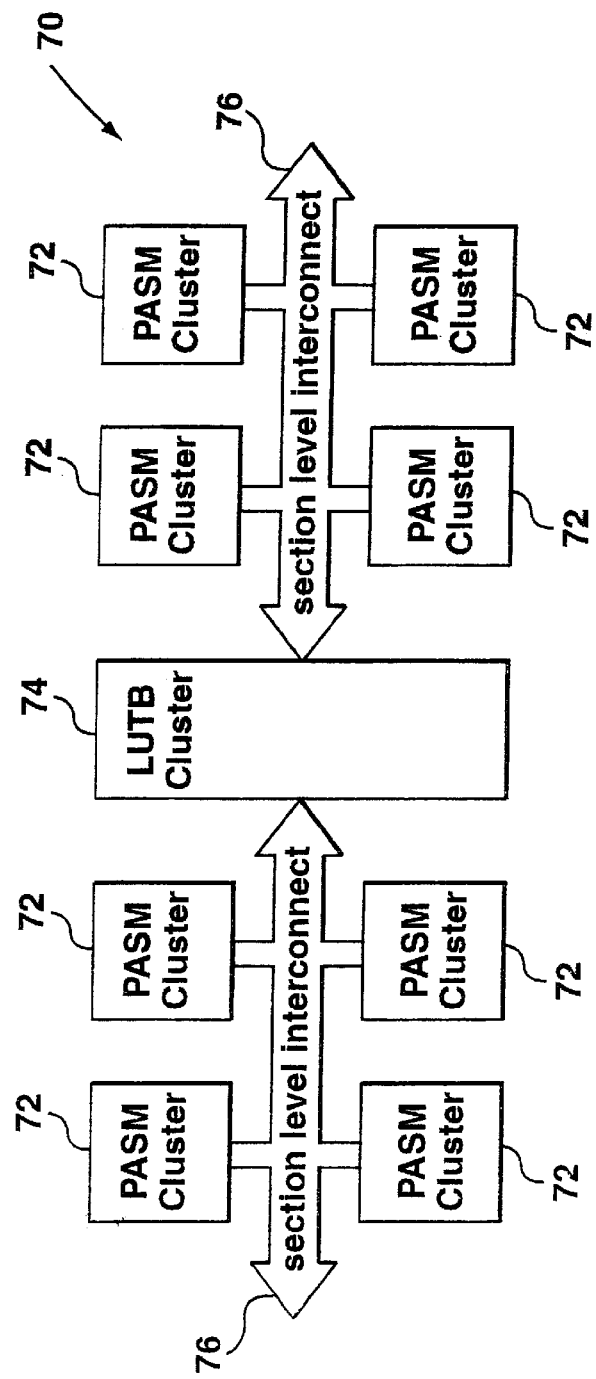
FIG. 6 is a block diagram of a preferred computational field programmable architecture (CFPA) section of the present invention.

With reference to FIG. 6, a preferred embodiment of a section of a CFPA of the present invention, indicated generally by 70, has a hierarchical architecture and includes two main logic resources, namely cluster 72 and clusters 74, which are connected together by a section level interconnect 76. The cluster 74 is generally used to realize the control part of circuits that are implemented using the CFPA 70, and is based on Look Up Tables (LUTs). The clusters 72 are used to realize data path operations, and are made up of a plurality of programable logic circuit blocks 10 (see FIG. 1) that are specifically configured to efficiently realize common arithmetic structures such as adders, subtracters, multipliers and comparators.

Figure 1:
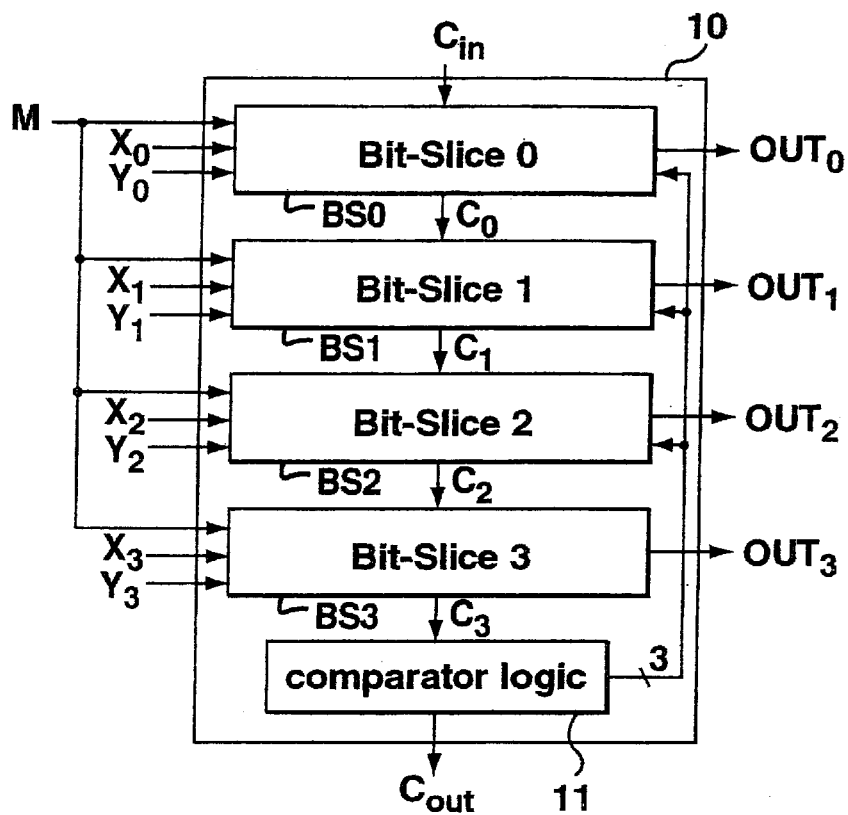
FIG. 1 is a block diagram of a preferred embodiment of a partial add subtract multiply (PASM) programable logic block in accordance with the present invention.

The programable logic circuit block 10 is the core building block of the present invention and is referred to herein as a PASM (Partial Add Subtract Multiply) block 10. The PASM block 10 offers a platform on which common arithmetic structures such as adders, subtracters, multiplies and comparators can be implemented. The PASM block 10 of FIG. 1 is a nibble structure and operates on two 4-bit operands. The PASM block 10 includes a vertical stack of four bit-slice circuits or elements BS0 to BS3, each of which has two data-bit inputs Xi and Yi, (where i denotes the position of the respective bit slice element in the block 10, from 0 to 3), and a single data-bit output OUTi. Thus, the PASM block has two 4 bit vectors as data inputs, X (comprising X0 to X3) and Y (comprising Y0 to Y3), and a 4 bit vector as a data output OUT (comprising OUT0 to OUT3). The PASM block 10 also includes a carry-in bit input Cin, a carry-out bit output Cout, and a multiplication bit input m. The PASM block 10 also includes comparator logic 11.

Figure 2:
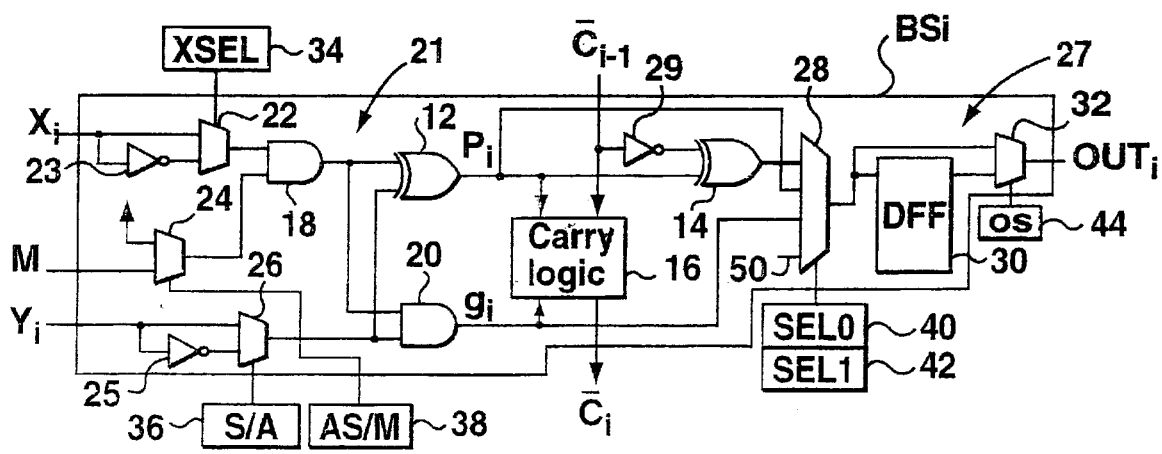
FIG. 2 is a schematic of a bit-slice circuit of the PASM block of FIG. 1.

A circuit diagram of an exemplary bit-slice element BSi is shown in FIG. 2. Each bit-slice element BSi includes a 1-bit full adder circuit provided by 2 XOR gates 12 and 14, and carry logic 16. Each bit-slice element BSi also includes operation select circuitry, indicated generally by 21, comprising 2 AND gates 18 and 20, 2 inverters 23 and 25, and 3 2:1 multiplexers 22, 24 and 26. The multiplexers 22,24 and 26 are controlled by control means comprising programable SRAM cells X-select (XSEL) cell 34, add subtract/multiply (AS/M) cell 38, and subtract/add (S/A) cell 36, respectively. The operation select circuitry 21 allows the bit slice elements BS0 to BS3 to be programmed such that the PASM block 10 can be configured to perform ripple-carry addition, subtraction and partial multiplication, and also perform bit-wise logical operations.

Each bit-slice element BSi also includes output logic circuitry, indicated generally by 27, which includes a 4:1 output select multiplexer 28, an edge-triggered D flip-flop (DFF) 30, and a 2:1 output multiplexer 32. As explained in greater detail below, the DFF 30 and output multiplexer 32 enable synchronization and pipelining. Among other things, the output select multiplexer 28 is used to save output pins by multiplexing 4 distinct logic outputs onto a single pin.

As shown in FIG. 2, one input of multiplexer 22 is connected to the input Xi, its other input is connected through an inverter 23 to the input Xi, and its operation is controlled by SRAM cell XSEL 34. The multiplexer 24 has one input connected to the multiply bit m, one input connected to a logic 1, and its operation controlled by SRAM cell AS/M 38. The multiplexer 26 receives Yi as one input; the complement of Yi through inverter 25 as its other input, and is controlled by SRAM cell S/A 36. The outputs of multiplexers 22 and 24 are the two inputs of AND gate 18. The output of AND gate 18 and the output of multiplexer 26 provide the two inputs of XOR gate 12 and AND gate 20. The output Pi (propagate signal) of XOR gate 12, and the output gi (generate signal) of AND gate 20 each are connected to different inputs of carry logic 16 and output select multiplexer 28. The output Pi of XOR gate 12 is also connected to one input of XOR gate 14, the other input of which is connected to the carry bit input C(i−1). (The carry-in-bit input C(i−1) is actually provided in complement form to each of the bit-slice elements other than BS, so each of the bit-slice elements BS1 to BS3 each include an inverter 29 before the relevant input of XOR gate 14 to invert the signal C(i−1). The carry bit input C(i−1) will be Cin for BS0). The output of XOR gate 14 is connected to one of the inputs of the output select multiplexer 28. The carry logic 16 includes the complement of carry bit C(i−1) as one of its inputs, and complement of carry bit Ci as an output.

The operation of output select multiplexer 28 is controlled by SRAM cells SEL0 40 and SEL1 42, and its output is provided directly to one input of output multiplexer 32, and through DFF 30 to the other input of output multiplexer 32. The output of output multiplexer 32 is the output bit OUTi of the bit-slice element BSi, and the operation of multiplexer 32 is controlled by SRAM cell OS 44.

Figure 3:
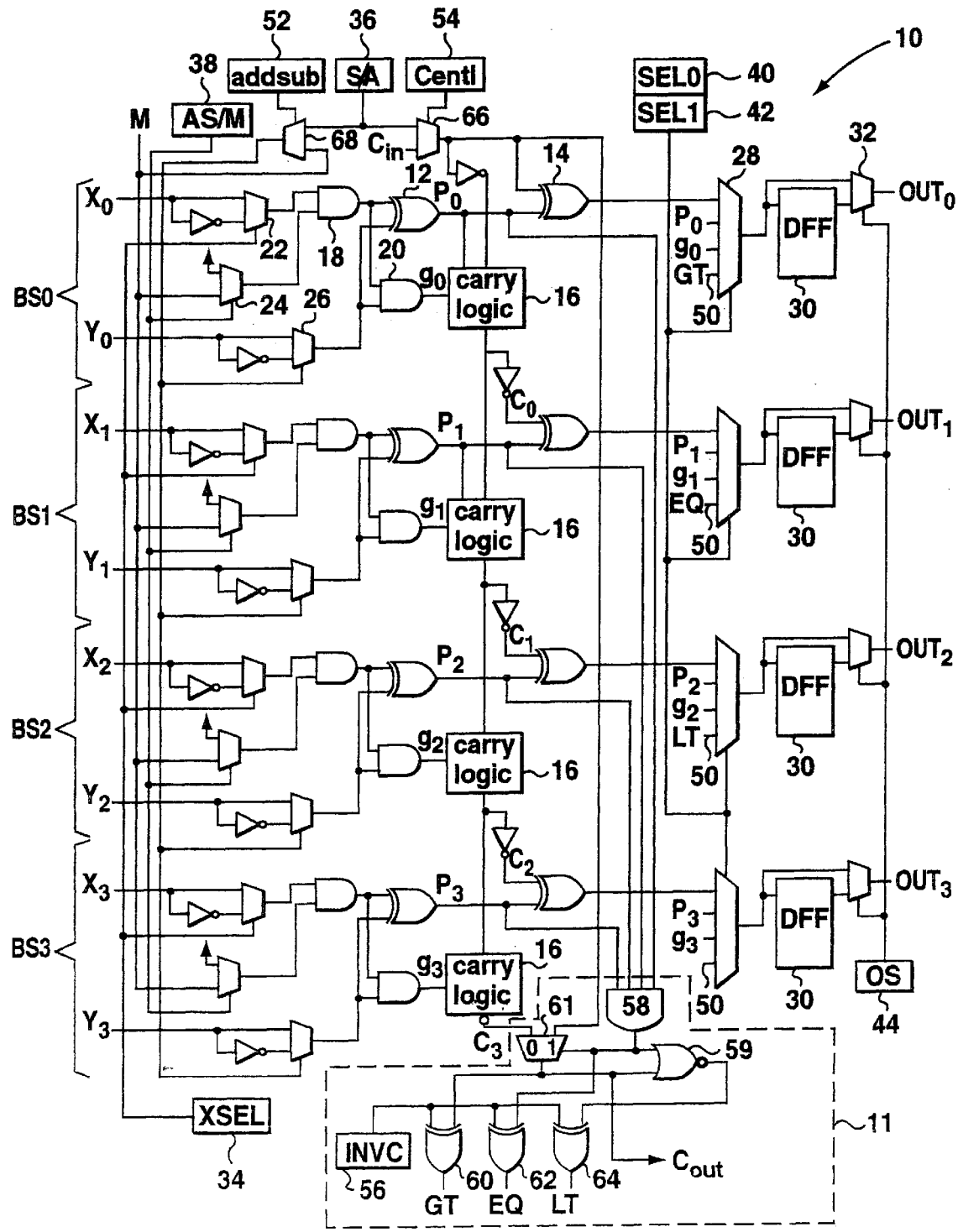
FIG. 3 is a schematic of the PASM block of FIG. 1.

FIG. 3 shows a schematic of the stack of four bit-slice elements BS0–BS3 and comparator logic circuit 11 of the PASM block 10. The carry-in bit input C(i−1) of each successive bit-slice element BSi is connected to the carry-out bit output Ci of the preceding bit slice element BSi. The multiplier bit input m of the bit-slice elements are all tied to the multiplication bit input of the PASM block 10.

As can be seen in FIG. 3, the S/A SRAM cell 36 is not connected directly to the control input of the multiplexers 26 of the bit-slice elements BS0–BS3, but rather is connected as one input to a 2:1 multiplexer 68, the output of which is connected to each of the four multiplexers 26 of the PASM Block 10. The other input of multiplexer 68 is connected to the multiply bit input m, and its control input is connected to an SRAM cell 52 (addsub). The S/A SRAM cell 36 is also connected as one input to a 2:1 multiplexer 66, whose other input is provided by the carry-in bit input Cin of the block 10. The multiplexer 66 is controlled by SRAM cell 54 (Ccnt1). The output of multiplexer 66 provides the carry-in bit input for the first bit-slice element BS0.

The comparator logic circuit 11 includes 3 XOR gates 60,62 and 64, a 4-input AND gate 58, NOR gate 59 and 2:1 multiplexer 61. The propagate output Pi of each of the bit-slice elements BS0–BS3 provide the four inputs to AND gate 58. The output of AND gate 58 controls the operation of multiplexer 61, which has one of its data inputs connected to the carry-outbit output C3 of bit-slice BS3, and the other of its data inputs connected to the output of multiplexer 66. The output of multiplexer 61 is the carry-out bit Cout of block 10, and is also connected to one input of XOR gate 60, and one input of NOR gate 59. The other input of NOR gate 59 is connected to the output of AND gate 58, and the output of NOR gate 59 is connected to an input of XOR gate 64. The output of AND gate 58 is also connected to an input of XOR gate 62. The other inputs of each of the XOR gate 60,62, and 64 is connected to a further SRAM cell 56 (INVC).

Operation of the PASM block 10 is programmed and controlled by the 9 SRAM cells mentioned above.

The manner in which bit slices BS0 to BS3 can be configured to implement an adder, subtracter, multiplier and to provide a variety of bit-wise boolean operations will now be described.

A 1-bit full adder is realized by the bit slice element BSi when: the XSEL cell 34 is programmed to select Xi as the output of multiplexer 22; the AS/M cell 38 is programmed to select a logic 1 rather than M as the output of multiplexer 24; and the S/A cell 36 and addsub cell 52 are programmed to select Yi as the output of multiplexer 26. The output of XOR gate 14 generates the sum bit of the adder and is available as the output of the bit-slice section BSi, if selected through the 4:1 multiplexer 28. The output BSi can be selected as combinational or registered, depending on the value stored in the output select SRAM cells SEL 40 and SEL1 42.

A subtracter is very similar in function to a full adder, assuming use of 2's complement number representation. The conversion of a number from unsigned format to 2's complement format is straightforward. It is done by inverting all the bits then adding 1. In PASM block 10, this is accomplished by using an inverter for each input bit, and forcing a 1 on the carry input of the least significant bit (as discussed in greater detail below). Although both the Xi and Yi inputs are available in true and complemented forms, only one of Xi or Yi should be inverted. Thus, in order to configure each bit-slice element BSi to implement a subtracter, the bit-slice element BSi is configured the same as it is for an adder with the only differences being that the SRAM cell S/A 36 selects the complement of Yi as the output of multiplexers 26, and the carry-in bit of the least-significant bit-slice element BS is forced active.

Figure 4A:
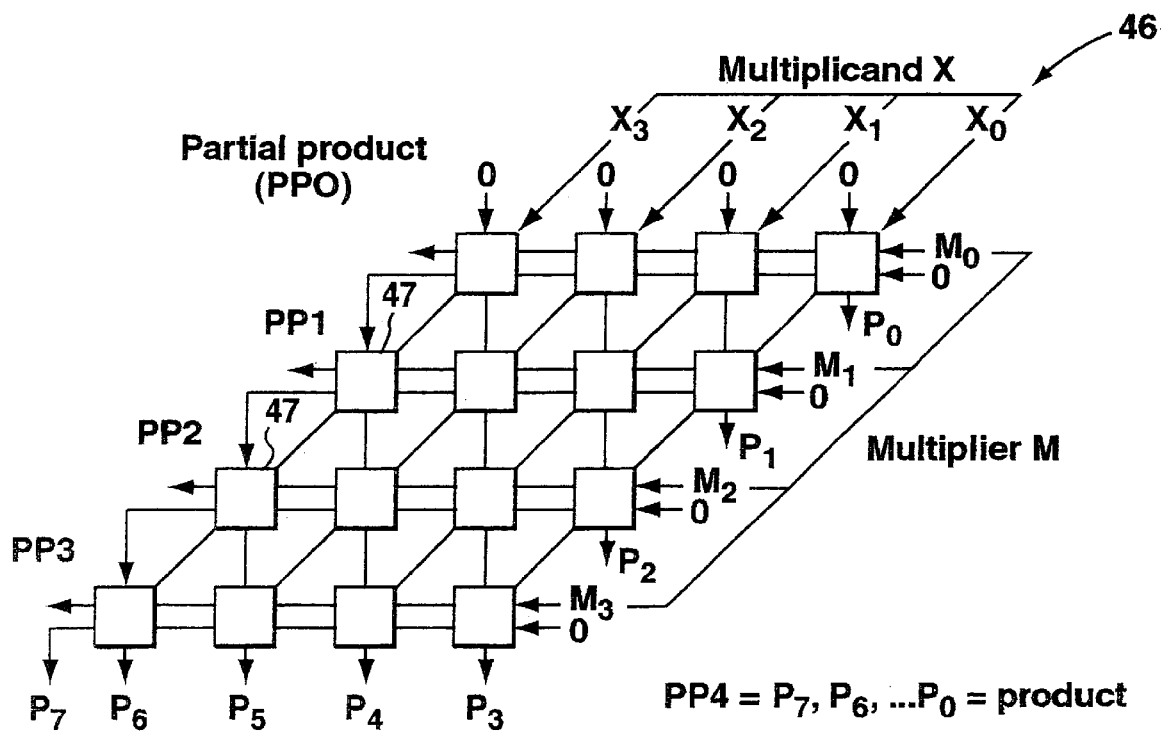
FIG. 4a is a block diagram of multiplier realized in hardware as an array.
Figure 4B:
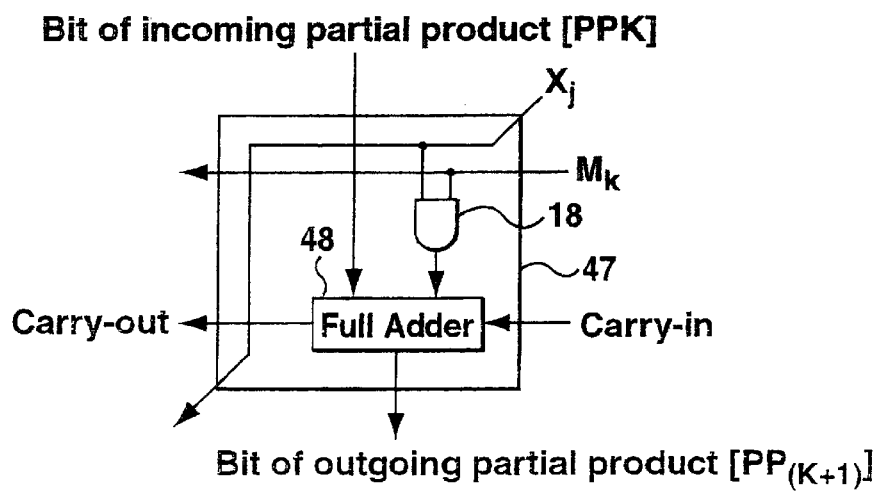

Four PASM blocks 10 can be used to implement an unsigned array multiplier 46 as shown in FIG. 4a. The array multiplier 46 includes 4 rows of 4 logic cells 47, in which each row is implemented using a PASM block 10 (each bit slice BSi realizing one of the logic cells 47 in the row). In multiplier array 46, a multiplicand X is multiplied by each bit of a multiplier M, to form 4 summands. The addition of the four summands forms the product. Each row of the array 46 generates its summand, and adds the summand to the incoming partial product (PPk). The incoming partial product to that row represents the sum of all the previous summands. Generating the correct summand bit in each cell 47 is accomplished by ANDing the bit of the multiplier Mk and the bit of the multiplicand Xj. A full adder 48 (realized by the 1-bit full adder circuitry of each bit slice elements) sums the summand bit to the bit of the incoming partial product PPk. A PASM bit-slice element BSi can be configured to implement such a logic cell 47 by: setting the XSEL cell 34 to select Xi as the output of multiplexer 22; and setting the AS/M cell 38 to select m as the output of multiplexer 24. In such configuration, the m input is ANDed with the Xi input, and the rest of the bit-slice circuit BSi functions as a 1-bit full adder. It will thus be appreciated that the multiplexer 24 and AND gate 18 provide a programable by-passable AND gate, which allows the bit-slice element to be placed in or out of multiply mode. When the AS/M cell 38 selects the logic one input of multiplexer 24, the AND gate 18 is effectively by-passed. When the AS/M cell 38 selects the multiplier bit m as the input of multiplexer 24, the Xi input is ANDed with the multiply bit m.

Several bit-wise boolean operations are available in a PASM bit-slice element, including AND, NOR, XOR and XNOR operations. The AND operation is simply gi, in FIG. 2, while the XOR operation is Pi. The NOR operation can be computed as $\overline{Xi}\cdot\overline{Yi}$, while the XNOR function is $\overline{Xi}\oplus Yi$ or $\overline{Yi}\oplus Xi$. These functions, along with the sum output of XOR gate 14 are inputs to the 4:1 multiplexer 28. A fourth input 50, representing either the equal (EQ), less than (LT) or greater than (GT) functions (depending on the bit slice element) acting on the two four-bit data vectors (X0–X3 and Y0–Y3) is also available.

With reference to FIG. 3, the GT signal appears at the input 50 of the output select multiplexer 28 of the first bit-slice element B50. The EQ and LT signals appear at the inputs 50 of the output select multiplexers 28 of the second and third bit-slices BS1 and BS2, respectively, while the bottom bit slice BS3 has its multiplexer input 50 tied to ground. The GT, EQ and LT signals are generated by the outputs of XOR gates 60,62 and 64 of comparator logic circuit 11 (the relevant connect lines are not shown in FIG. 3 to minimize clutter). The details of how the EQ, LT and GT signals are generated are discussed in greater detail below.

The carry logic in PASM block 10 is implemented with the intention of making propagation as fast as possible and implemented with as little logic as possible. The carry-out signal Cout is derived by rippling the carry through the four PASM bit-slice elements BS0 to BS3. Since the propagate (Pi) and generate (gi) signals are all derived in parallel (as soon as the input lines are driven), the delay is equal to four carry-logic unit delays plus the delay to generate the Pi and gi signals. The four-input AND gate 58 functions as a carry-skip gate and is used to determine if a propagate condition exists for all pairs of data inputs. If so, the carry-in signal is immediately propagated as the carry-out signal Cout of the PASM block 10.

The PASM block 10 can function as a 4-bit comparator. The available operations are X=Y (EQ), X<Y (LT), X>Y (GT), X≠Y (NEQ), X≦Y (LTEQ) and X≧Y (GTEQ). The comparator logic 11 performs these operations. To minimize the number of output pins, the comparator outputs are multiplexed on the output pins of three of the PASM bit-slices BS0 to BS2. Consequently three comparison outputs are available at a time, namely either the EQ, LT and GT operations, or the NEQ, LTEQ and GTEQ operations. Note that the NEQ, LTEQ and GTEQ outputs are generated by inverting the EQ, GT and LT outputs, respectively. This is accomplished using XOR gates 60, 62 and 64 with the output of the SRAM 56 labelled INVC (Invert Comparator) acting as the toggle bit.

If X and Y are equal and the PASM block 10 is configured as a subtracter, then Pi is a logic 1. The four-input AND gate 58 then indicates whether or not all four input bit pairs are equal. Consequently, the EQ signal is taken from the output of the four-input AND gate 58. If the result of X−Y is positive, meaning that X>Y, the carry-out will be a logic 0. Conversely, if the result is negative, the carry-out will be a logic 1. Hence, the GT output can be generated using the carry-out signal. Lastly, the LT operation can be represented as LT=$\overline{EQ \cdot GT}$, which is the NOR of the EQ and GT signals.

The programming bits of the PASM block 10 will now be discussed in greater detail. It will be appreciated that the PASM block 10 is a flexible logic block capable of performing a number of different operations. SRAM cells were chosen as a means of offering easy re-programmability and as mentioned above, only 9 are needed to program the PASM block 10 which is desirable for reconfigurable computing. The SRAM cell OS (output select) 44 is dedicated to selecting either the combinational output signal or the registered version. The four DFF's 30 can be combined to form a 4-bit register that can be shifted in both directions depending on the programming of the block 10 and its routing.

The two SRAM cells SEL0 and SEL7 (40 and 42) control which signal each 4:1 output select multiplexer 28 selects. The SRAM cell INVC 56 determines whether the EQ, GT, and LT outputs, or the NEQ, LTEQ and GTEQ outputs are selected. Recall that for a subtract operation, a logic 0 must be forced on the carry-in bit. This is accomplished by the SRAM cell S/A (subtract/add)36. However for addition, the true input carry is needed, so the output of the S/A SRAM cell 36 and the true carry input signal Cin are connected to multiplexer 66 that is controlled by the SRAM cell labelled Ccntl (carry control) 54. For multiplication, it is necessary to AND the multiplicand bit m with the X input, however for addition/subtraction, the X input should not be affected by the value of m. Therefore the m bit and a logic 1 are connected to the multiplexers 24 of each bit slice element, the multiplexers 24 being controlled by the SRAM cell labelled AS/M (add subtract/multiply) 38. Lastly, the X and Y inputs need to switch between their true and complemented forms. This is done by connecting Xi and the complement of Xi to the multiplexer 22 of each bit slice, the operation of which is controlled by the SRAM cell 34 labelled XSEL. The same is true for Yi and the complement of Yi. The multiplexers 26 that are used for Yi and its complement in each bit slice are controlled by the output of a second multiplexer 68. This second multiplexer 68 has m and the output of the SRAM cell S/A 36, as its inputs and is controlled by the SRAM cell addsub 52. The reason for using this second control multiplexer 68 is to allow m to act as a toggle bit controlling the mode of the PASM block 10. If m is a logic 1, the PASM block 10 will behave as a subtracter, while a logic 0 will make the PASM block 10 act as an adder. For this to work, the carry-in bit Cin must be connected to m.

Figure 5:
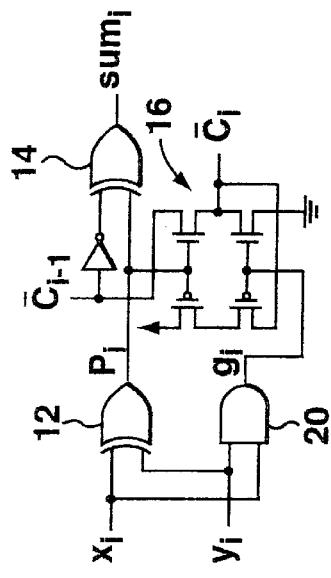
FIG. 5 is a schematic of a carry-logic circuit of the bit-slice circuit of FIG. 2.

A preferred implementation of the carry logic circuit 16 is shown in FIG. 5. The carry logic circuit 16 is responsible for generating the appropriate carry-out signal given the carry-in, propagate (Pi) and generate (gi) signals. The logic equation for the carry-out signal is given by $$Co = gi + Pi \cdot C_{i-1}$$

In operation, the PASM bit-slice element outputs OUT0 to OUT3 have to drive the inputs of adjacent PASM blocks, and so output drivers are preferably connected to the outputs of each of the bit-slice elements BS–BS3. The output drivers preferable have tri-state capability to allow a programmable connection to interconnect wires. A single SRAM (referred to herein as the Drive SRAM) can be used to program the 4 output drivers of a block 10. For example, if the Drive SRAM stores a 1, the out put drivers are turned on, otherwise, the driver outputs are tri-stated.

Figure 7:
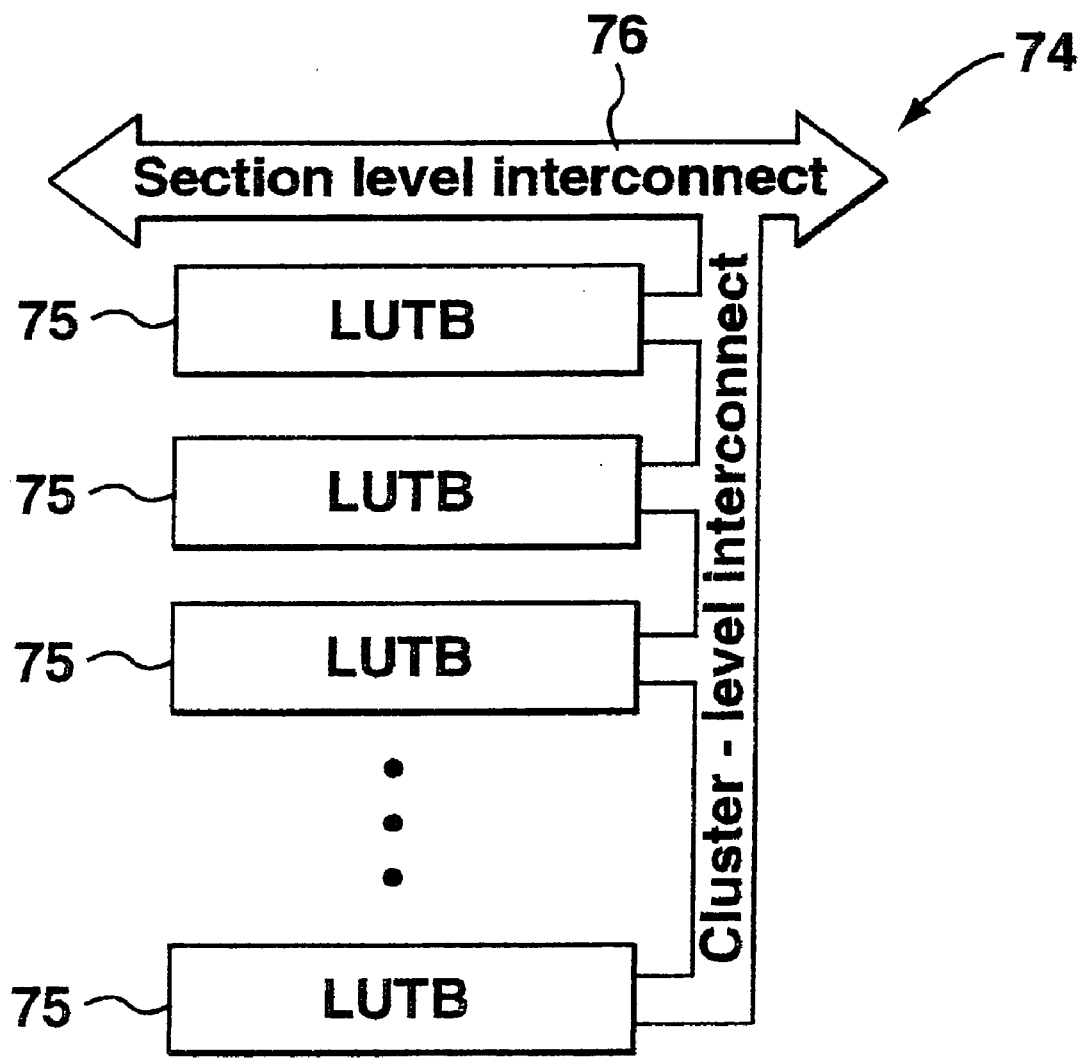
FIG. 7 is a block diagram of a LUTB cluster of the CFPA section of FIG. 6.

Referring again to FIG. 6, as mentioned above, the CFPA section 70 consists of two types of logic clusters, namely clusters 72, which include PASM blocks 10, and cluster 74, which includes Look Up Table Blocks (LUTBs). In one exemplary embodiment illustrated in FIG. 7, LUTB cluster 74 includes 16 LUTB's 75 connected by a local interconnect 77 to section level interconnect 76. Each LUTB contains four 4-input Look Up Tables (LUTs) that are connected through a filly-populated crossbar, to provide a collection of 64 LUTs in total. As the LUTB cluster 74 is similar to commercial FPGAs, the structure of the LUTB cluster 74 will not be described in great detail. The LUTB cluster 74 is included in CFPA section 70 because many compute intensive applications contain some control circuitry that cannot be efficiently mapped to PASM blocks, and so the LUTBs implement the control part of a circuit, while the PASM blocks implement the date path part of a circuit.

Figure 8:
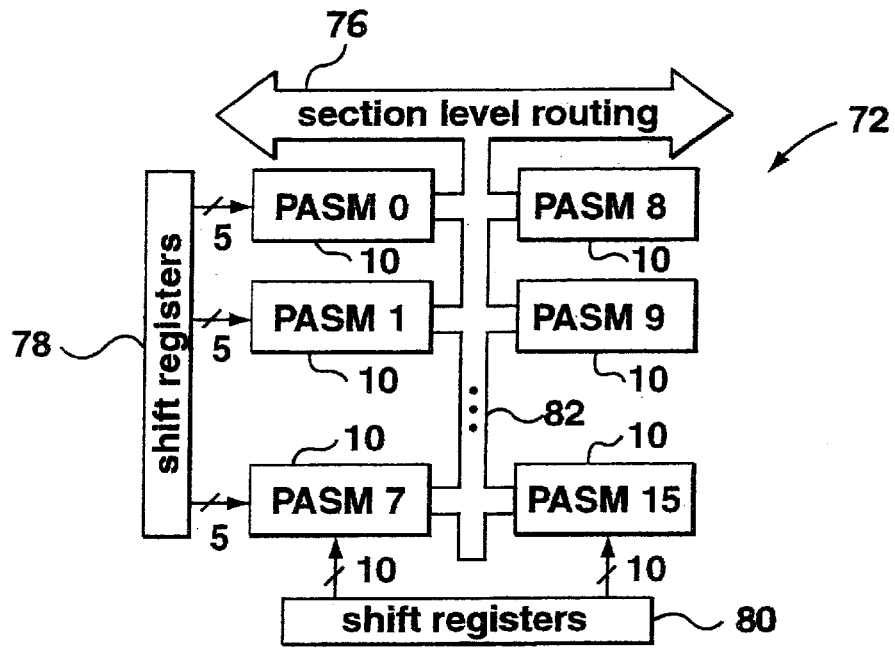
FIG. 8 is a block diagram of an exemplary PASM cluster of the CFPA section of FIG. 6, including shift registers for programming the PASM cluster.

The CFPA section 70 includes 2 levels of hierarchy: section-level routing channels interconnect channels 76, and cluster-level routing channels. The lowest level of hierarchy in the CFPA 10 is the PASM cluster 72. With reference to FIG. 8, an exemplary PASM cluster 72 includes 16 PASM blocks 10 laid out in an 8 row by 2 column configuration and connected together by a local interconnect channel referred to herein as cluster level interconnect 82. The exact number of PASM blocks in a cluster can be other than 16, however for the purpose of explaining the present invention an exemplary size of 16 is used. Such a configuration can easily be used to implement modestly sized arithmetic structures such as 64-bit adders. The arrangement of the PASM blocks 10 in an 8 row by 2 row configuration facilitates section-level interconnect wires. The PASM cluster 72 includes shift registers 78 and 80 for programming the SRAM cells in the cluster, as discussed in grater detail below.

Figure 9:
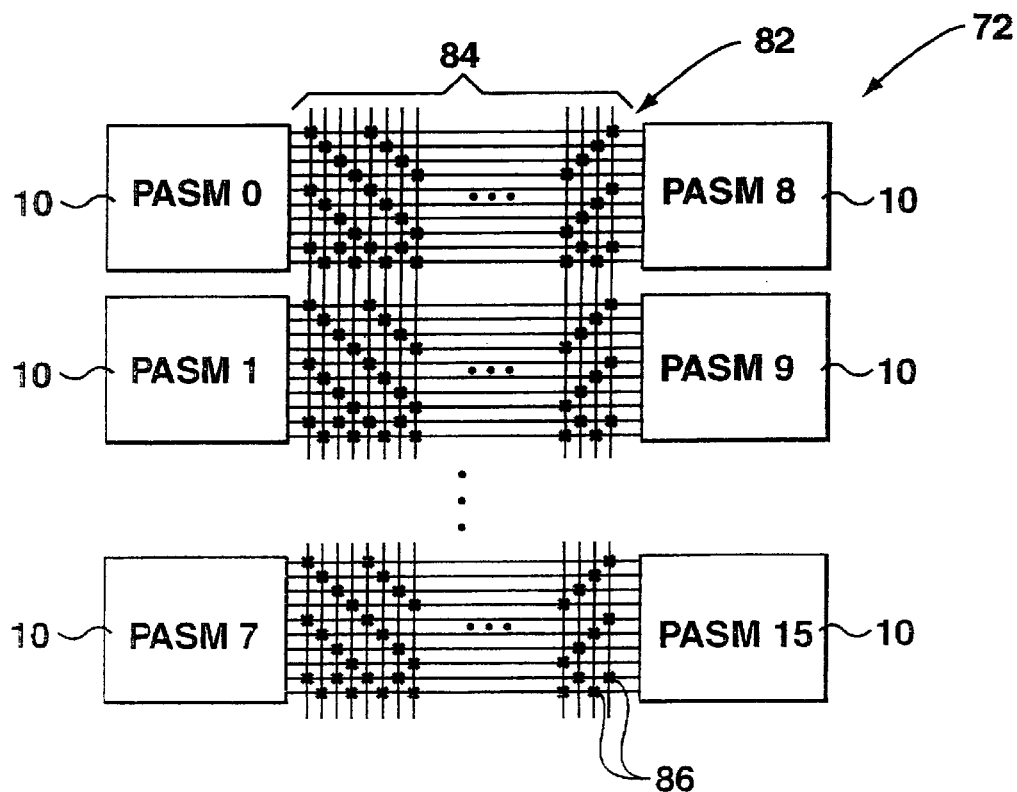
FIG. 9 is a further block diagram of a PASM cluster of the CFPA section of FIG. 6, showing the cluster level interconnect of the cluster.

The cluster-level interconnect 82 permits data flow inside the PASM cluster. As illustrated in FIG. 9, in one preferred embodiment the cluster-level interconnect 82 includes 76 cluster level tracks 84 that are connected to the inputs of the PASM blocks 10 through a partially populated cross bar. It will be understood that each PASM block 10 has 10 data inputs ($X_0$–$X_3$, $Y_0$–$Y_4$, Cin and m). The 76 tracks 84 in the cluster-level interconnect 82 can be connected to the 10 inputs of a PASM block 10 using more than 130 switches 86. Each input of each PASM block 10 can be connected to 13 tracks of the cluster-level interconnect 82, on average. The switches that allow the connection of the tracks in a cluster channel to each input of a PASM block 10 are implemented using a routing multiplexer. Although the programming of a PASM block 10 is nibble controlled, the inputs of the block can be connected to the cluster channel independently.

As illustrated in FIG. 9, the switches 86 are logically arranged such that each of the four bits of an input vector can connect to the cluster-level wires with minimal interference from the other three input vector bits. For example, the X0 input connects to wire 1, X1 to wire 2, X2 to wire 3 and X3 to wire 4. The second connection of X is to wire 5, X1 to wire 6 and so on. The Y inputs follow a similar pattern.

As mentioned above, routing multiplexers are used to connect cluster tracks 84 to each PASM block 10. It will be appreciated that pass-transistor switches could alternatively be used in the interconnect, however such method would require that a separate SRAM cell be used for each switch, thus increasing the size of the PASM tile.

Figure 10:
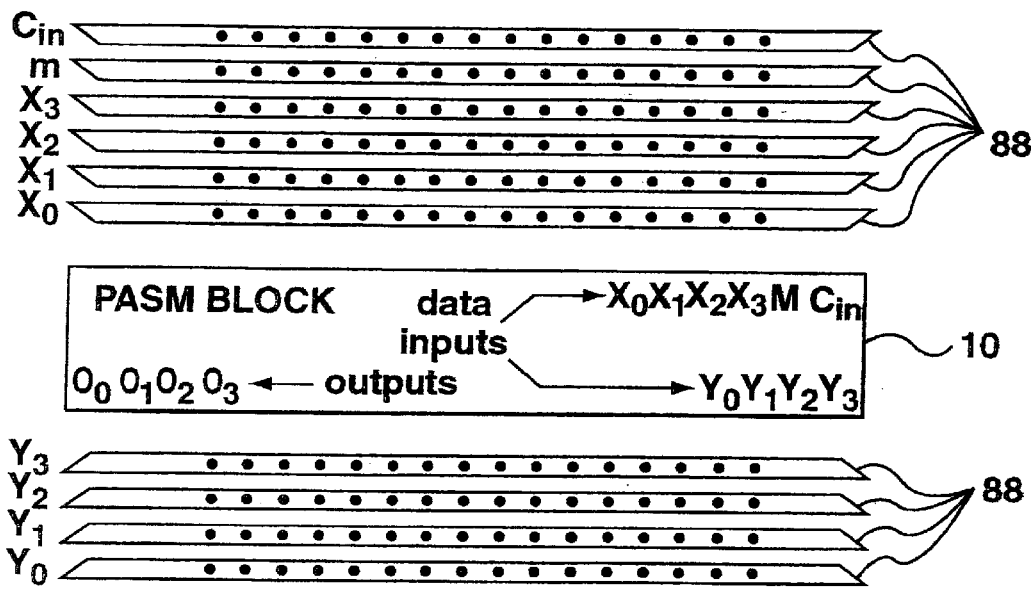
FIG. 10 is a block diagram of a cluster interconnect template for a PASM block.
Figure 11:
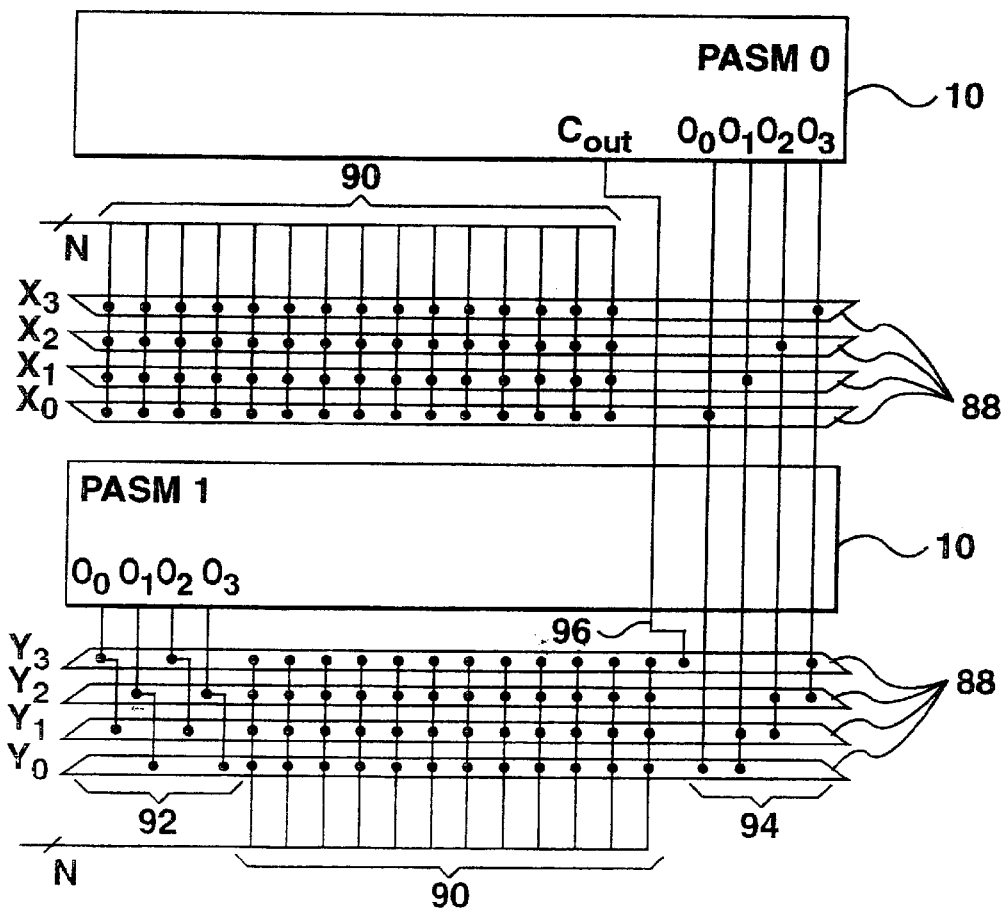
FIG. 11 is a partial schematic of the cluster-level interconnect for two vertically adjacent PASM blocks.

FIG. 10 illustrates a cluster interconnect template in accordance with one preferred form of the PASM cluster. Ten routing multiplexers 88 are used for each PASM block 10 (one for each of the data inputs of the block 10, as labelled in FIG. 10). Preferably, each of the multiplexers 88 is a 16:1 multiplexer implemented by a conventional NMOS pass-transistor circuit that is controlled by 4 SRAM cells. To avoid clutter in FIG. 10, the connections from the multiplexers outputs to the PASM block 10 inputs are not shown. Instead, the label to the left of each multiplexer 98 indicates which PASM input ($X_0$–$X_3$; $Y_0$–$Y_3$; m or Cin) it feeds. A dot on a multiplexer 88 indicates an electrical connection to a multiplexer input. The cluster interconnect 82 is preferably a combination of bit-controlled and dedicated wires, and will now be explained in greater detail with reference to FIG. 11, which illustrates a simplified cluster level interconnect for two vertically adjacent PASM blocks 10 (labelled as PASM and PASM1). For ease of understanding, only the multiplexer input connections for PASM1 are shown in the figure. As well, only the multiplexers for the data input vectors X and Y are shown. The lines 90 indicate inputs to multiplexers 88 that come from bit-controlled wires. Note that to avoid clutter in FIG. 11, lines 90 appear to be shared by 4 multiplexer inputs. In reality, each multiplexer input joins the cluster interconnect 82 by a unique wire. Each X input multiplexer connects to 15 interconnect wires 90, while each Y input multiplexer connects to 12 interconnect wires 90. Lines 92 indicate feedback wires from a PASM block 10 outputs to its inputs. These wires 92 are used to implement shift registers. This is only done on the Y inputs to conserve inputs to the X multiplexers. Shifting can be done either to the right of left. Lines 94 indicate PASM0 outputs that are sent to the immediately lower PASM1 as inputs. Both the X and Y inputs can be connected in this way. The Y input also gets shifted input data to facilitate multiplication. The X input does not get shifted data because the PASM architecture is not symmetrical for multiplication. Lastly, line 96 represents the carry-out bit of the immediately upper PASM. It is a dedicated connection needed for multiplication, but only feeds the Y3 input multiplexer. The carry-out bit is also brought as a dedicated input to the carry-in multiplexer, but this is not shown in FIG. 11.

The dedicated routing lines 92, 94 and 96 provide fast and area-efficient connections between adjacent PASM blocks 10, which simplifies the implementation of multipliers, fast adders, and shift registers.

The programming of the SRAM cells associated with each PASM bock 10 will now be explained. It will be understood that in the preferred embodiment discussed above, each PASM block 10 and its routing area has 50 SRAM cells: 9 in its core architecture, 1 for its output driver, and 4 for each of its 10 routing multiplexers. Accordingly, each PASM cluster has 800 SRAM cells. Each SRAM cell has a data wire input and a control wire input, and is programmed when its control wire is asserted, causing the SRAM cell to lock in the data value present on its data wire. Preferably, a two-dimensional grid of control and data lines are used to allow the SRAM cells in each PASM block 10 of a PASM cluster 72 to be programmed. With reference to FIG. 8, in one exemplary embodiment, a 40 output program data shift register 78 has 8 sets of 5 output lines, each set being connected to the SRAM's in a horizontally adjacent pair of PASM blocks 10 to drive program-data lines (pgm-data) thereto. A 20 output program control shift register 80 has 2 sets of 10 output lines, each set being connected to the SRAM's in one column of the PASM block 10 to drive ten program-control (pgm-cntl) lines thereto. This 20×40 grid permits all 800 SRAM cells to be programmed.

An H-tree design is used to distribute a clock signal to the 64 flip-flops located in each PASM cluster 72 in order to minimize clock skew between PASM blocks. An H-tree design is also used to distribute a global rest signal.

Figure 12:
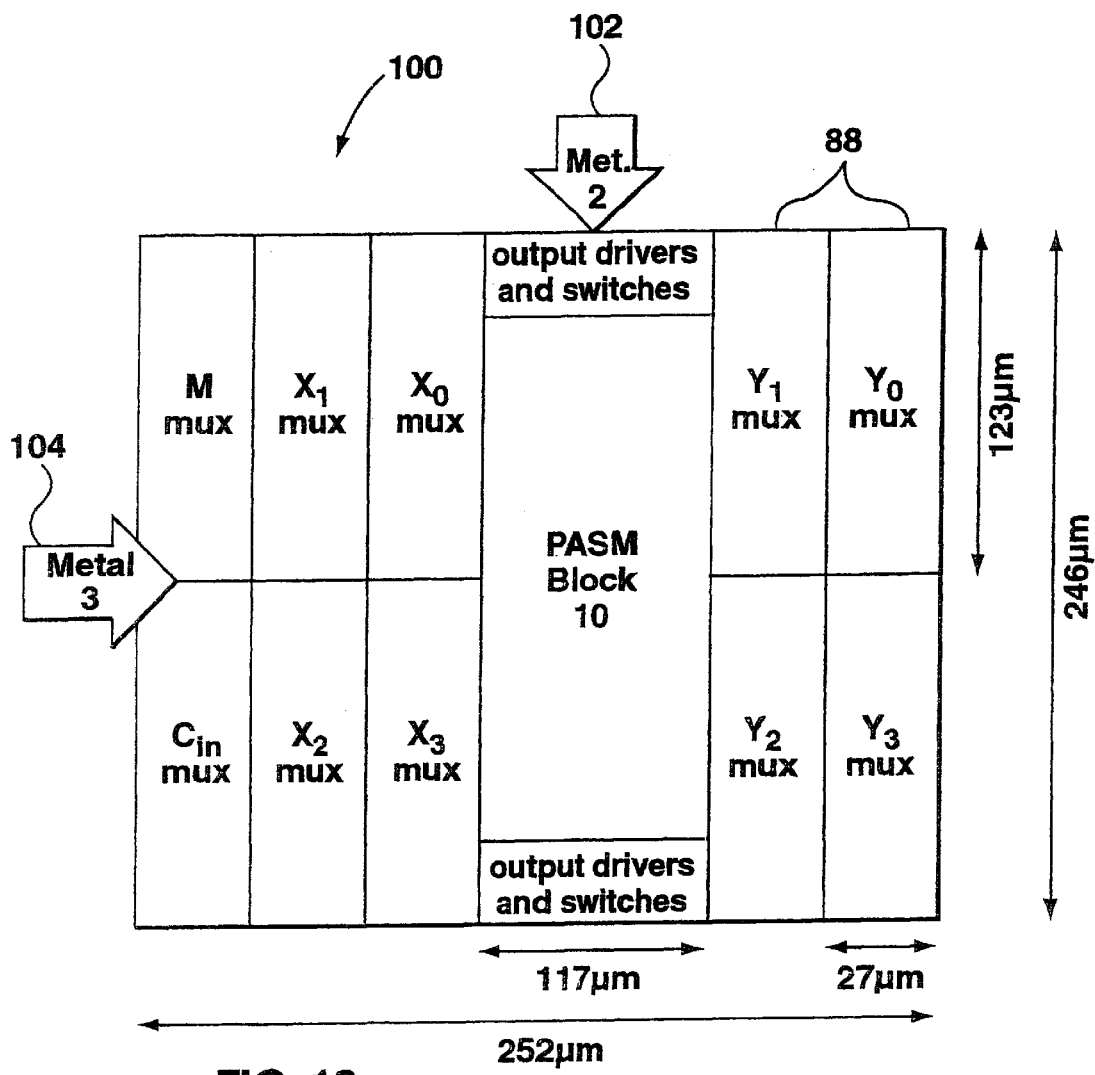
FIG. 12 is a block diagram of a layout of a PASM tile.

One exemplary implementation and layout of a PASM block 10 can be done in a 0.5 micron CMOS process with 3 metal layers referred to herein as metal 1, metal 2 and metal 3 layers. FIG. 12 illustrates one preferred tile layout 100 of the PASM block 10 and its routing area. In particular, FIG. 12 shows the metal 1 layer, which is used mostly for local connections, while the metal 2 and metal 3 layers run over the tile 100 orthogonally in the vertical and horizontal directions, as illustrated by arrows 102 and 104, respectively. Possible dimensions of the tile 100 and its components are shown in FIG. 12. With respect to the routing area of PASM block 10, six of the routing multiplexers 88 are located on the left side of tile 100 and four on the right. The two leftmost multiplexers are for the carry-in and multiplier control inputs. The remaining four are connected to the X data inputs. The four multiplexers on the right side are connected to the Y data inputs. The PASM block 10 is located in the middle of the tile 100, with bit-slice output drivers above and below.

Cluster-level interconnect wires are implemented in metal 3. The 8 row by 2 column shape of the PASM cluster 72 as shown in FIGS. 9 and 10 permits 38 cluster-level interconnect wires to pass over each PASM block 10.

Metal 2 can be used for section-level interconnect wires that are used to share data between different PASM clusters 72, and in or between LUTBs in LUTB cluster 74 and PASM clusters 72.

Figure 13:
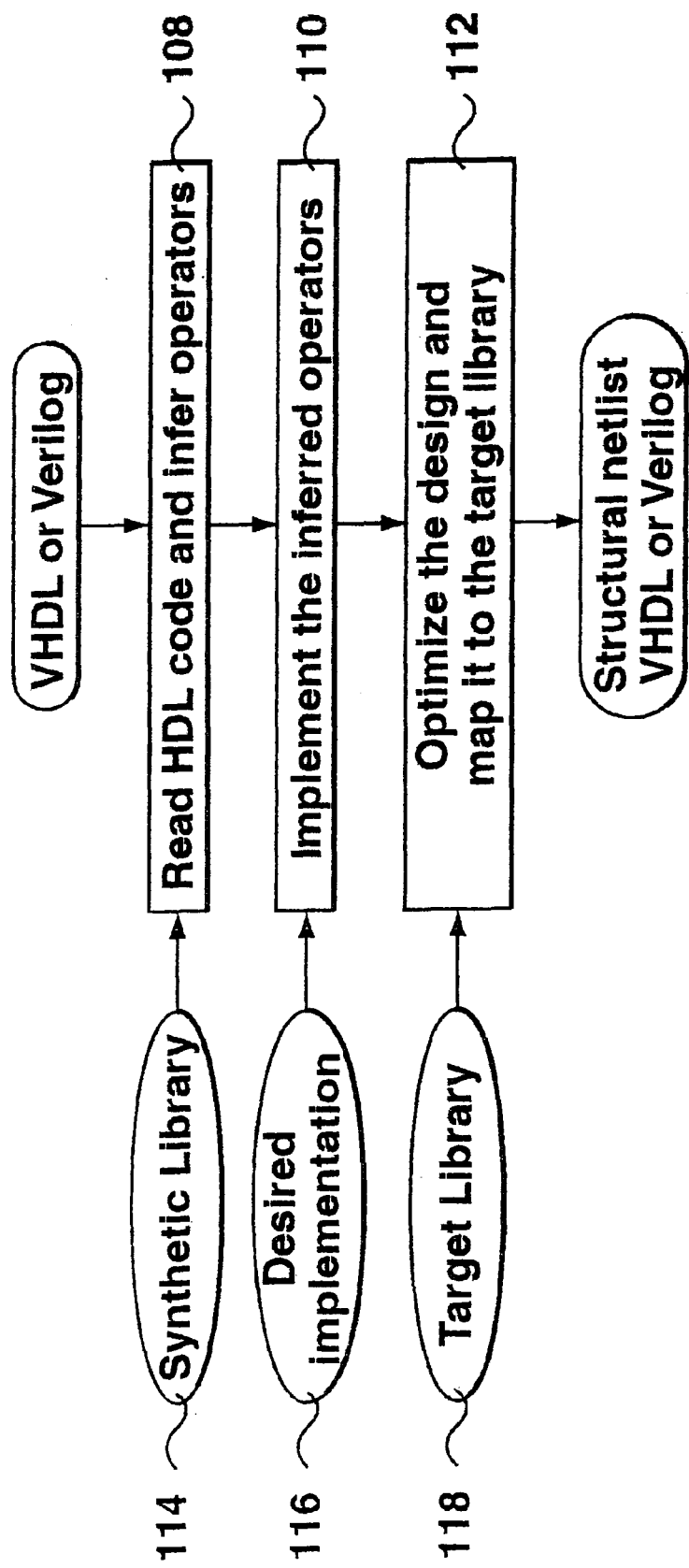
FIG. 13 is a flow chart of the operation of a CFPA technology mapper of the present invention.

The synthesis of a circuit to the CFPA will now be discussed. As the majority of applications in signal processing are written in some form of Hardware Description Language (HDL), a technology mapper that reads Register-Transfer Level (RTL) or behavioural code in Verilog or VHDL, and generates a structural netlist containing PASMs and LUTs is preferably used for the top-front of the synthesis flow. The technology mapper can use Synopsys (Trademark) synthesis tools to read the HDL code. Using Design Ware (DW)Developer (Trademark) the mapping process can be customized to target CFPA. FIG. 13 presents Synopsys synthesis flow as used in a CFPA technology mapper. Solid rectangles 108, 110, 112 represent the normal synthesis flow in Synopsys. DW developer permits control of the design flow, shown with ovals 114, 116, 118 in FIG. 13.

An appropriate target library 118, synthetic library 114, and several implementations are used to make the mapping process to CFPA possible. The target library 118 contains several library cells as well as their functionality, area and timing constraints. Each cell corresponds to one specific function of the PASM block. The library also includes a 4-input LUT for parts of the circuit that cannot be efficiently mapped to PASM blocks.

The synthetic library 114 for CFPA is included to use DW. This library contains the definition of operators that need to be inferred from the HDL code. Also, the modules and their implementations that are supposed to replace the operators are defined in the synthetic library. Many common operators in HDL circuits, such as add and multiply are already defined in standard.sldb, which is provided by Synopsys as the default synthetic library. However, also defined are some new operators such as bitwise AND for the CFPA technology mapper. The structural implementations of modules such as multipliers are provided in a design library that can be accessed by the synthetic library. The CFPA synthetic library 114 directs Synopsys to infer the operators from the HDL code and to choose the modules and their best implementations that are provided in the design library. Snyopsys tools support implementations in either Verilog or VHDL.

In order to estimate the advantages of the CFPA of the present invention, compute-intensive circuits were mapped to the CFPA and also to general purpose FPD's, and the silicon area for each case estimated. Table 1 shows the results for some basic circuits. The results are translated into silicon area in HP(trade-mark) CMOS14, which is a 0.5 micron process.

TABLE 1

Area comparisons of standard FPGA architecture and CFPA architecture.

| Circuit | FPGA area (square mm) | CFPA area (square mm) |
| --- | --- | --- |
| Adder (12 bits) | 0.54 | 0.195 |
| Unsigned Multiplier (8 × 6) | 4.14 | 0.78 |
| Signed Multiplier (8× 6) | 4.68 | 0.91 |
| IIR | 95 | 19.58 |
| FIR (pipelined) | 45 | 17.73 |

It will be appreciated that FIG. 6 illustrates a single CFPA section 70. A complete CFPA chip may comprise one or more sections, with appropriate interconnection wiring. Although the PASM block 10 has been described as a nibble structure, it will be appreciated that it could also be constructed to process vector inputs containing more or less than 4 bits, in which case the PASM block would have a corresponding number of bit slices. For example, it could be constructed to process 2 bit inputs, or 8 bit inputs, or other size inputs. Additionally, the number of PASM blocks in a cluster could be other than as described above. Furthermore, it will be understood that the number of cluster level tracks and switches could vary depending on the configuration of the cluster 72, the number of PASM blocks therein, and the number of bit-slice elements in each of PASM blocks.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

We claim:

1. A field programmable architecture for compute-intensive applications, comprising:

a section level interconnect channel;

a first logic cluster for implementing control logic, comprising a plurality of logic blocks interconnected by a local interconnect channel that is in communication with said section level interconnect channel; and a second logic cluster for implementing data path operations, comprising a plurality of programable logic blocks interconnected by a cluster level interconnect channel that is in communication with said section level interconnect channel, said programable logic blocks each configured to perform operations on two N-bit operands and comprising:

(a) a stack of N bit-slice logic elements each having two data bit inputs, a data bit output a multiply bit input, a carry-in bit input a carry-out bit output a programable operation select circuit for processing inputs received by said two data bit inputs and said multiply bit input, and a 1-bit full adder circuit for generating a sum-bit output and said carry-bit output in response to information received from said operation select circuit and said carry-in bit input the carry-in bit input of each successive bit slice logic element being connected to the carry-out bit output of the preceding bit-slice logic element; and (b) control means for programming the operation select circuits of each of said bit slice logic elements in order to selectively configure said programable logic block to implement one of a ripple carry adder subtracter and partial multiplier, said programable logic blocks of said second logic cluster having a different configuration than the logic blocks of said first logic cluster such that said programable logic blocks provide a more area-efficient realization of adders, subtracters and partial multipliers than the logic blocks of said first logic cluster.

2. The field programable architecture according to claim 1 wherein the programable operation select circuit of each of said bit-slice logic elements includes a plurality of multiplexers, and said control means includes a plurality of programable SRAM cells operatively connected to said multiplexers.

3. The field programmable architecture according to claim 2 wherein each of said bit-slice logic elements includes an output logic circuit having an output multiplexer with a plurality of inputs, one of said inputs being connected to a sum-bit output of said adder circuit, said control means including means for selecting the output provided by the output multiplexer of the output logic circuit of each of said bit-slice elements.

4. The field programmable architecture according to claim 3 wherein said programable logic block includes comparator logic connected to said bit slice logic elements for generating logic outputs based on the relative values of said two N-bit operands, said comparator logic having different output lines for different logic comparisons, said output lines each being connected as an input to the output multiplexer of a different one of said bit-slice elements.

5. The field programmable architecture according to claim 1 wherein the value of N is within the range of 2 to 6.

6. The field programmable architecture according to claim 1 including a plurality of said second logic clusters, wherein the logic blocks of said first logic cluster are Look Up Table logic blocks.

7. A programmable logic block that can be configured to perform addition, subtraction and partial multiplication on two N-bit operands, comprising:

(a) a stack of N bit-slice logic elements, each having two data bit inputs, a data bit output, a multiplier bit input, a carry-in bit input, and a carry-out bit output, the carry-in bit input of each successive bit-slice logic element being connected to the carry-out bit output of the preceding bit-slice logic element, each of said bit-slice elements including (i) a 1-bit full adder circuit for generating a sum-bit output on said data bit output and having carry logic connected to receive said carry-in bit input and generate an output on said carry-out bit output; and (ii) a programable operation select circuit connected to said 1-bit full adder circuit for selectively processing data received on said two data bit inputs and said multiplier control bit input, and providing said selectively processed data to said adder circuit, said operation select circuit of each of said bit-slice logic elements being programable such that said stack of bit-slice logic elements can selectively implement adders, subtracters and partial multipliers; and (b) control means for programming the operation select circuit of each of said bit-slice logic elements.

8. The programable logic block according to claim 7 wherein said operation select circuit includes a by-passable AND gate which allows an input signal on said multiply-bit input to be ANDed with an input signal on one of said two data bit inputs when said programable logic block is configured to perform partial multiplication.

9. The programmable logic block according to claim 8 wherein said full adder circuit of each of said bit slice elements comprises a first XOR gate and a second XOR gate, the output of said first XOR gate and said carry-in input being the inputs of said second XOR gate, the output of said second XOR gate generating the sum-bit output of said adder, the output of said by-passable AND gate being connected to an input of said first XOR gate.

10. The programable logic block according to claim 9 wherein said programable operation select circuit includes a plurality of control multiplexers, and said control means including a plurality of SRAM cells, wherein each of said SRAM cells is operatively connected to said control multiplexers in each of said N-bit slices.

11. The programmable logic block according to claim 9 wherein each of said bit-slice logic elements includes an output logic circuit having an output select multiplexer with a plurality of inputs, one of said inputs being connected to receive the sum-bit output of said adder circuit and the output of said output select multiplexer being in communication with said data bit output, said control means including means for selecting the output provided by the output select multiplexer of each of said bit-slice logic elements.

12. The programable logic block according to claim 11 including a comparator logic circuit connected to each of said bit-slice logic elements for generating logic outputs based on the relative values of said two N-bit operands, said comparator logic circuit having different output lines for different logic comparisons, said output lines each being connected as an input to the output select multiplexer of a different one of said bit-slice elements.

13. The programable logic block according to claim 12 wherein the output circuit of each of said bit-slice elements includes a D flip-flop connected to the output of said output select multiplexer, and a switch for connecting the output of said D flip flop or the direct output of said output multiplexer to said data bit output, thereby enabling the stack of N bit-slice logic elements to function as a shift register.

14. The programmable logic block according to claim 11 wherein said logic block is nibble controlled and includes four of said bit-slice elements.

15. A programmable logic cluster for implementing data path operations comprising:

a plurality of programmable logic blocks for performing operations on 2 N-bit operands, said programable logic blocks each having 2 sets of N data bit inputs, a carry-in bit input, a multiply bit input, a carry-out bit output and a set of N data bit outputs, and including N bit-slice logic elements for performing bit-wise operations on said operands, and a comparator logic circuit connected to each of said bit-slice logic elements for generating logic outputs based on the relative values of the 2 N-bit operands, said programable logic blocks being programmable to realize adders, subtracters, and partial multipliers; and a cluster level interconnect channel interconnecting said plurality of programable logic blocks, having a plurality of cluster level tracks connected to the inputs of each of said programable logic blocks through switches located on a partially populated crossbar.

16. A programable logic cluster for implementing data path operations comprising:

a plurality of programmable logic blocks for performing operations on 2 N-bit operands, said programable logic blocks each having 2 sets of N data bit inputs, a carry-in bit input, a multiply bit input, a carry-out bit output and a set of N data bit outputs, and including N bit-slice logic elements for performing bit-wise operations on said operands, said programable logic blocks being programable to realize adders, subtracters, and partial multipliers;

a cluster level interconnect channel interconnecting said plurality of programable logic blocks, having a plurality of cluster level tracks connected to the inputs of each of said programable logic blocks through switches located on a partially populated crossbar, said cluster level tracks being connected to said inputs by routing multiplexers; and dedicated routing lines between adjacent programable logic blocks for implementing multipliers and fast adders.

17. The programable logic cluster according to claim 1 wherein N is 4.

* * * * *